United States Patent
Perner

(10) Patent No.: US 8,933,431 B2
(45) Date of Patent: Jan. 13, 2015

(54) DUAL-PLANE MEMORY ARRAY

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/006,719

(22) PCT Filed: Mar. 29, 2011

(86) PCT No.: PCT/US2011/030337
§ 371 (c)(1),
(2), (4) Date: Sep. 23, 2013

(87) PCT Pub. No.: WO2012/134450
PCT Pub. Date: Oct. 4, 2012

(65) Prior Publication Data
US 2014/0014891 A1 Jan. 16, 2014

(51) Int. Cl.
H01L 29/06 (2006.01)
H01L 47/00 (2006.01)
G11C 5/06 (2006.01)
H01L 25/00 (2006.01)
H01L 45/00 (2006.01)
H01L 27/24 (2006.01)

(52) U.S. Cl.
CPC ............ *H01L 45/12* (2013.01); *H01L 27/2481* (2013.01); *H01L 45/08* (2013.01); *H01L 45/1233* (2013.01); *H01L 45/146* (2013.01)
USPC ............... 257/5; 257/536; 257/774; 438/129; 438/382; 365/63; 365/148; 326/41

(58) Field of Classification Search
None
See application file for complete search history.

(56) References Cited

U.S. PATENT DOCUMENTS

| 5,835,396 | A | 11/1998 | Zhang |
| 6,778,421 | B2 | 8/2004 | Tran |
| 7,115,967 | B2 | 10/2006 | Cleeves |
| 7,684,245 | B2 | 3/2010 | Schumann et al. |
| 7,816,189 | B2 | 10/2010 | Subramanian et al. |
| 2007/0132049 | A1* | 6/2007 | Stipe ............................. 257/421 |

(Continued)

FOREIGN PATENT DOCUMENTS

| EP | 1492124 A2 | 12/2004 |
| JP | 2007165873 | 6/2007 |
| KR | 20100120117 | 11/2010 |

OTHER PUBLICATIONS

International Search Report, Korean IPO, Apr. 12, 2012, PCT Patent Application No. PCT/US2011/030337.

(Continued)

*Primary Examiner* — Andres Munoz

(57) ABSTRACT

A memory array has a plurality of conductor structures. Each conductor structure has a top wire segment extending in a first direction, a middle wire segment extending in a second direction at an angle from the first direction, a bottom wire segment extending in a direction opposite to the first direction, and a via connecting the top, middle, and bottom wire segments. A plurality of memory cells in an upper plane of the memory array are formed at intersections of the middle wire segment of each conductor structure with the top wire segments of neighboring conductor structures, and a plurality of memory cells in a lower plane are formed at intersections of the middle wire segment of each conductor structure with the bottom wire segments of neighboring conductor structures.

15 Claims, 9 Drawing Sheets

(56) References Cited

U.S. PATENT DOCUMENTS

| | | |
|---|---|---|
| 2007/0158716 A1* | 7/2007 | Rinerson et al. .............. 257/295 |
| 2009/0166682 A1* | 7/2009 | Scheuerlein ................. 257/211 |
| 2009/0168481 A1 | 7/2009 | Stipe |
| 2009/0256133 A1 | 10/2009 | Kau et al. |
| 2009/0261386 A1* | 10/2009 | Makino ........................ 257/210 |
| 2010/0155784 A1 | 6/2010 | Scheuerlein et al. |
| 2010/0162067 A1* | 6/2010 | Norman ........................ 714/746 |
| 2010/0208503 A1 | 8/2010 | Kuo |
| 2010/0308298 A1* | 12/2010 | Ninomiya et al. ................ 257/5 |
| 2012/0025386 A1* | 2/2012 | Murata ......................... 257/770 |

OTHER PUBLICATIONS

Supplementary European Search Report, Jul. 24, 2014, European Patent Application No. 11862142.4, 3 pages.

* cited by examiner

DUAL-PLANE MEMORY ARRAY

BACKGROUND

Memristive devices, or memristors, are a new type of switching devices with an electrically switchable device resistance. Memristive devices are both scientifically and technically interesting, and hold promise for non-volatile memory (NVM) and other fields. As today's flash memory technology is reaching its scaling limit, there is an urgent need for new memory technologies that can meet the storage capacity and access speed demanded by future applications. Memories using resistive switching devices, such as memristors, are a promising candidate for meeting that need. For NVM applications, many memristive devices can be formed in a multi-dimensional array to provide a very high storage capacity. The effectiveness of the multi-dimensional approach depends on the availability of an addressing scheme that can efficiently access individual memory cells in the array. In this regard, it is desirable to minimize the number of decoders required to implement the addressing scheme.

DETAILED DESCRIPTION

The following description provides a structure of a dual-plane memory array. The unique structure of the memory array enables an addressing scheme that allows a reduced number of decoders needed for accessing the individual memory cells in the array.

In some embodiments, the memory cells may be memristive devices. As used herein, a memristive device is a switching device with its resistance representing its switching state, and the resistance depends on the history of the voltage and current applied to the device. The resistive state of the device may represent a digital value. For instance, a high resistance of the device may indicate that the device is in an "OFF" state, which may represent a digital "0," while a low resistance may indicate that the device is in an "ON" state, which may represent a digital "1." The memristive device may be "bipolar," meaning that the device can be switched from a low-resistance state ("LRS") to a high-resistance state ("HRS") by applying a switching voltage of one polarity, and from a high-resistance state to a low-resistance state by applying a switching voltage of the opposite polarity. It should be noted, however, that the dual-plane memory structure described below is not limited to memristive devices and can used with other memory technologies, such as phase-change memories, and may be used for read-only memories with fused or anti-fuse memory cells.

Figure 1:
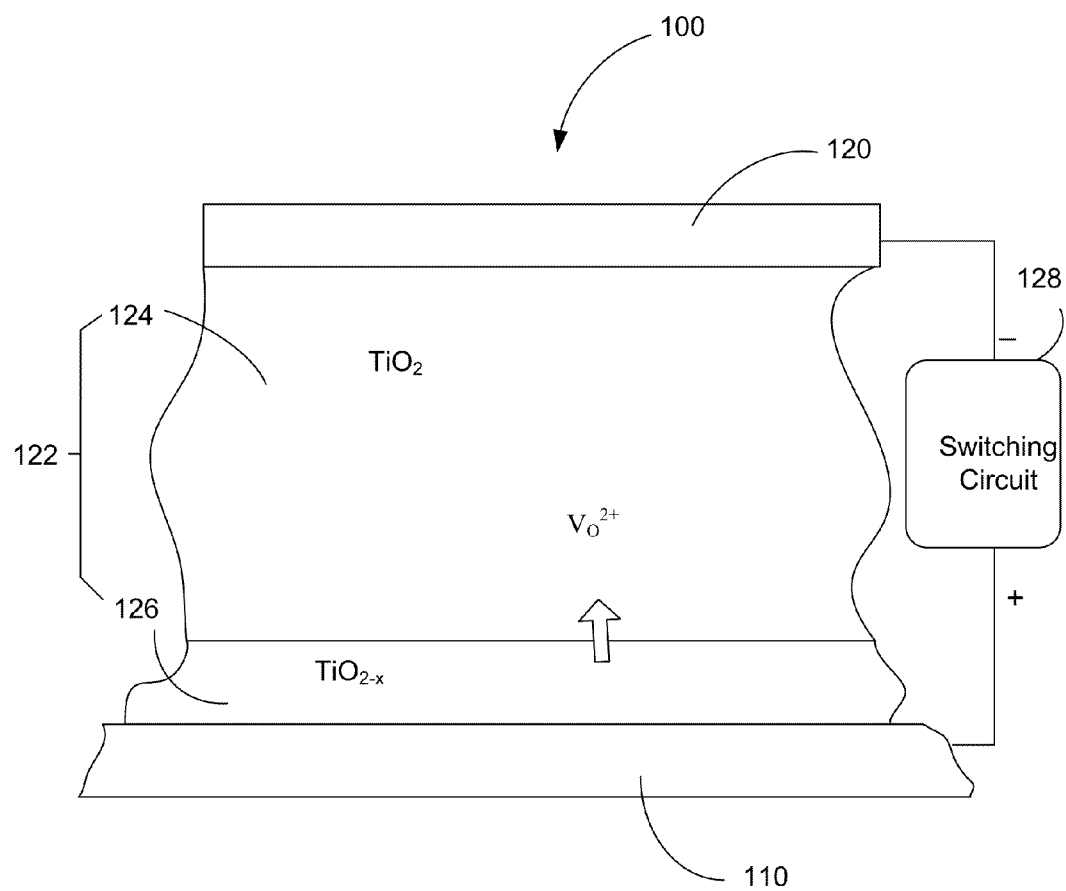
FIG. 1 is a schematic cross-sectional view of an example of a memristive device that may be used as a memory cell.

FIG. 1 shows, in a schematic form, an example of a bipolar memristive device 100. In the embodiment shown in FIG. 1, the memristive device is a two-terminal device, with a top electrode 120 and a bottom electrode 110. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a memory array to provide a high storage capacity.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The nanoscale switching device 100 can be switched between ON and OFF states by controlling the concentration and distribution of the oxygen vacancies in the switching material in the active region 122. When a DC switching voltage is applied across the top and bottom electrodes 120 and 110, an electric field is created across the active region 122. The switching voltage and current may be supplied by a switching circuit 128. The electric field across the active region 122, if of a sufficient strength and proper polarity, may drive the oxygen vacancies to drift through the switching material towards the top electrode 120, thereby turning the device into an ON state.

By way of example, as shown in FIG. 1, in one embodiment the switching material may be $TiO_2$. In this case, the dopants that may be carried by and transported through the switching material are oxygen vacancies ($V_O^{2+}$). The active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

Figure 2:
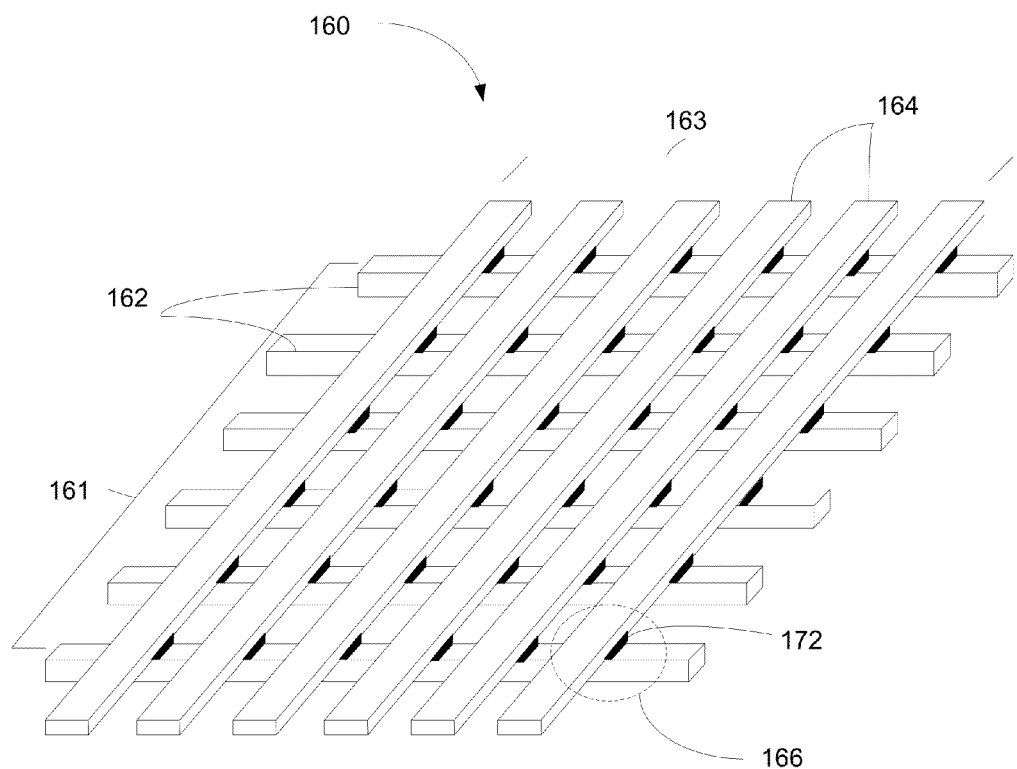
FIG. 2 is a schematic view of a conventional two-dimensional crossbar structure containing multiple memristive devices.

Memristive switching devices may be formed into an array for various applications that benefit from having a high density of switching devices. FIG. 2 shows an example of a conventional two-dimensional array 160 of memristive switching devices. The array 160 has a first group 161 of generally parallel nanowires 162 running in a first direction, and a second group 163 of generally parallel nanowires 164 running in a second direction at an angle, such as 90 degrees, from the first direction. One group of the nanowires may be labeled as the row lines, and the other group may be labeled as the column lines. The two layers of nanowires 162 and 164 form a two-dimensional lattice which is commonly referred to as a crossbar structure, with each nanowire 162 in the first layer intersecting a plurality of the nanowires 164 of the second layer, and vice versa. A memristive switching device 166 may be formed at each intersection of the nanowires 162 and 164. The switching device 166 has a nanowire of the second group 163 as its top electrode and a nanowire of the first group 161 as the bottom electrode, and an active region 172 containing a switching material between the two nanowires. Each memristive device 166 in the two-dimensional array can be uniquely addressed by selecting the row line and column line that form the electrodes of the memristive device.

The two-dimensional crossbar structure in FIG. 2 is shown mainly for the purpose of illustrating the concept that a array of memory cells may be formed at the intersections of multiple conducting wire segments, such as the conducting nanowires 162 and 164. In the crossbar 160, the memory cells are in a single plane. To achieve a higher memory density, an array with multiple planes of memory devices may be formed. One way of forming a multi-plane memory array is to vertically stack multiple layers of two-dimensional crossbars. Even though such a multi-layered crossbar array is conceptually simple, it may not be an ideal implementation of a multi-plane memory array for various reasons, such as the increasing complexity in forming effective connections to the nanowire segments and potential degradation of access performance, as well as the increased number of decoders required to address the individual memory cells.

Figure 3:
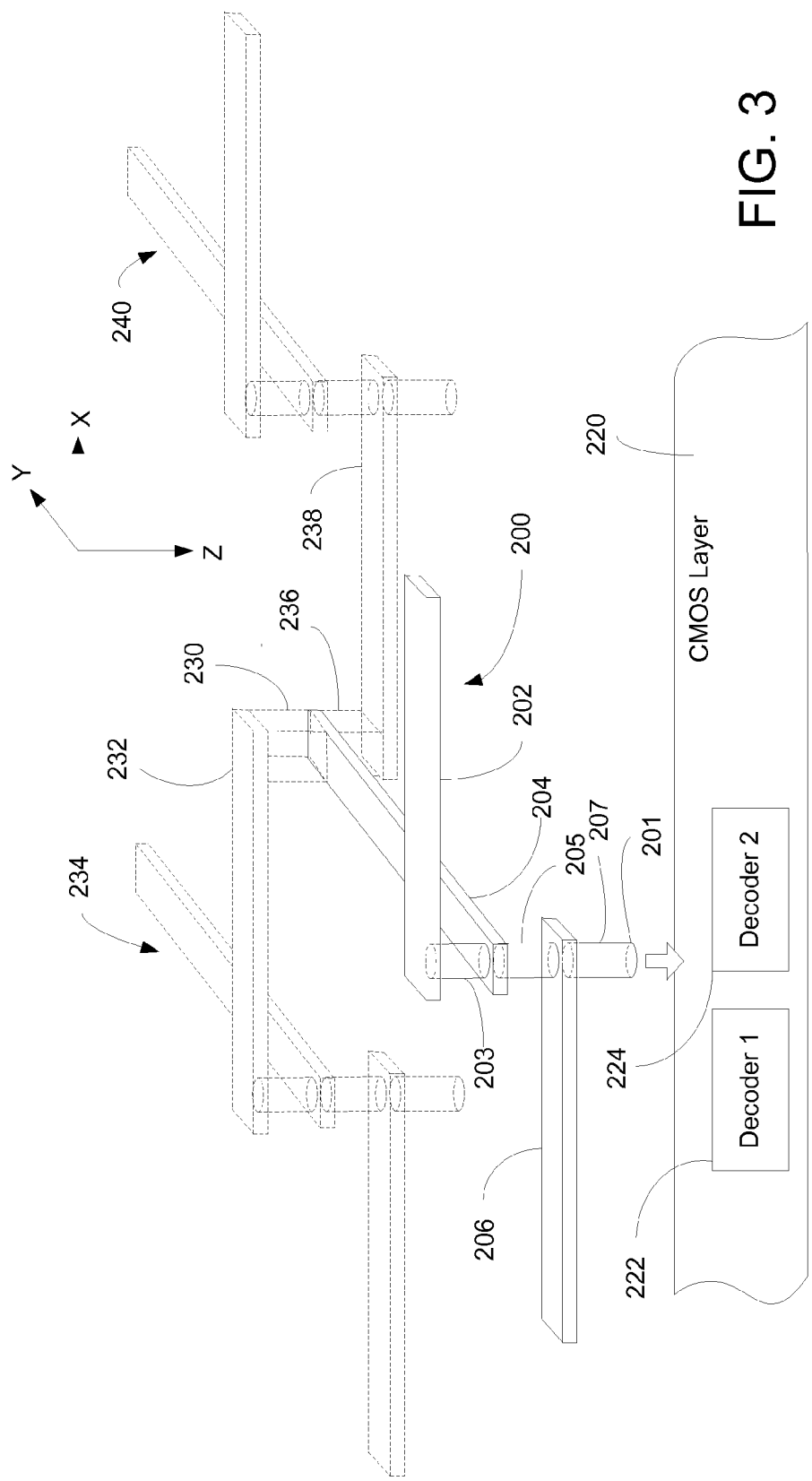
FIG. 3 is a perspective view of a conductor structure that can be used to from a dual-plane memory array.

In embodiments described below, a dual-plane memory array is provided. Its unique structure allows a significant reduction of the decoders used to decode the address data for accessing a selected memory unit in the array. Turning first to FIG. 3, the multi-plane memory array is constructed based on a unique conductor structure 200. The conductor structure 200 includes three wire segments. A first wire segment 202 is disposed on a top layer extending in a first direction. For convenience of reference, this direction is referred to as the X direction. A second wire segment 204 is disposed on a middle layer and extends in a second direction, referred to as the Y direction. The second direction is at an angle to the first direction, such as 90 degrees. A third wire segment 206 is disposed on a bottom layer and extends in a direction parallel but opposite to the first direction, i.e., in the −X direction. The three wire segments are connected at their respective ends by a via 201. The via 201 includes three sections. The first section 203 extends from the first wire segment 202 to the second wire segment 204, and the second section 205 extends from the second wire segment to the third wire segment 206. The third section 207 extends from the third wire segment 206 down and may be used to connect the conductor structure 200 to a CMOS layer 220 below. Although in FIG. 3 the via 201 is illustrated as a continuous post with a uniform diameter, in an actual memory array the three sections of the via may be formed at different stages of the fabrication process and may have different dimensions and may be offset slightly with respect to each other. As illustrated in FIG. 3, the CMOS layer 220 may include decoders, such as a decoder 222 for one set of (X, Y) coordinates and a decoder 224 for another set of (X, Y) coordinates, for decoding the address data used to access the conductor structures in the memory array.

Figure 4:
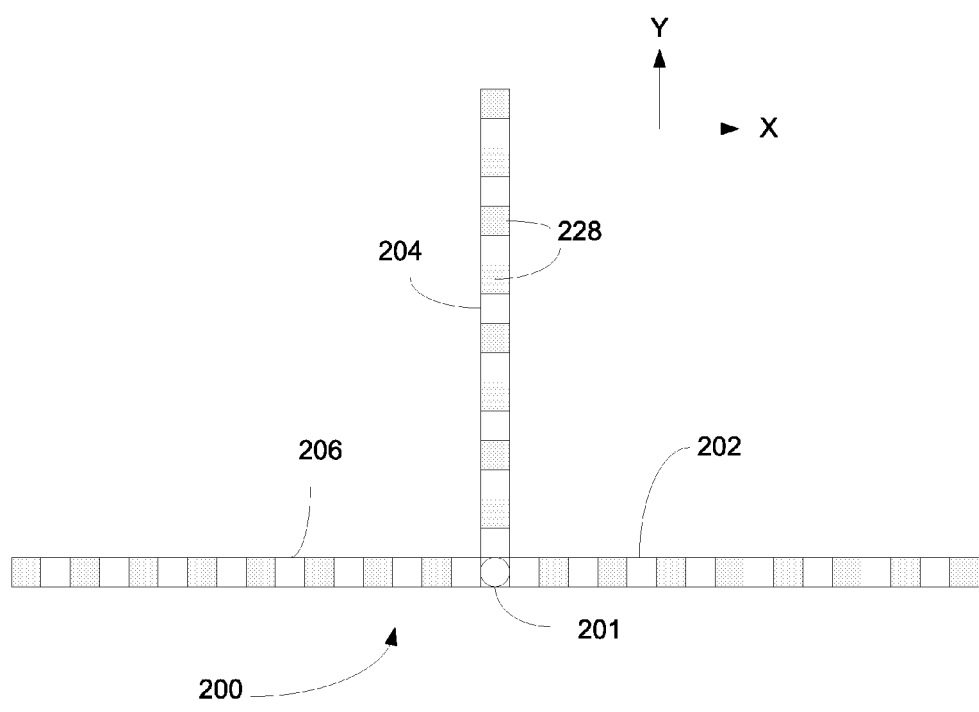
FIG. 4 is a top view of the conductor structure.

FIG. 4 shows a top view of the conductor structure 200. The three wire segments 202, 204, and 206 of the conductor structure are of the same length, which is selected based on the number of memory cells to be formed on each wire segment, such as 8, 16, 32, etc. In other words, the wire segments are dimensioned such that each top or bottom wire segment is to intersect the selected number of neighboring middle wire segments, and each middle wire segment is to intersect the selected number of top wire segments and the selected number of bottom wire segments. For example, in the embodiment of FIG. 4, each wire segment is to have 8 memory cells formed there on. Each memory cell 228, illustrated as a shaded region, is to be formed at the intersection of a wire segment of the conductor structure with a wire segment of another conductor structure on a different layer. For instance, as shown in FIG. 3, one memory cell 230 may be formed at the intersection of the middle wire segment 204 of the conductor structure 200 with a top wire segment 232 of another conductor structure 234, while another memory cell 236 may be formed at the intersection of the middle wire segment 204 with the bottom wire segment 238 of yet another conductor structure 240.

Figure 5:
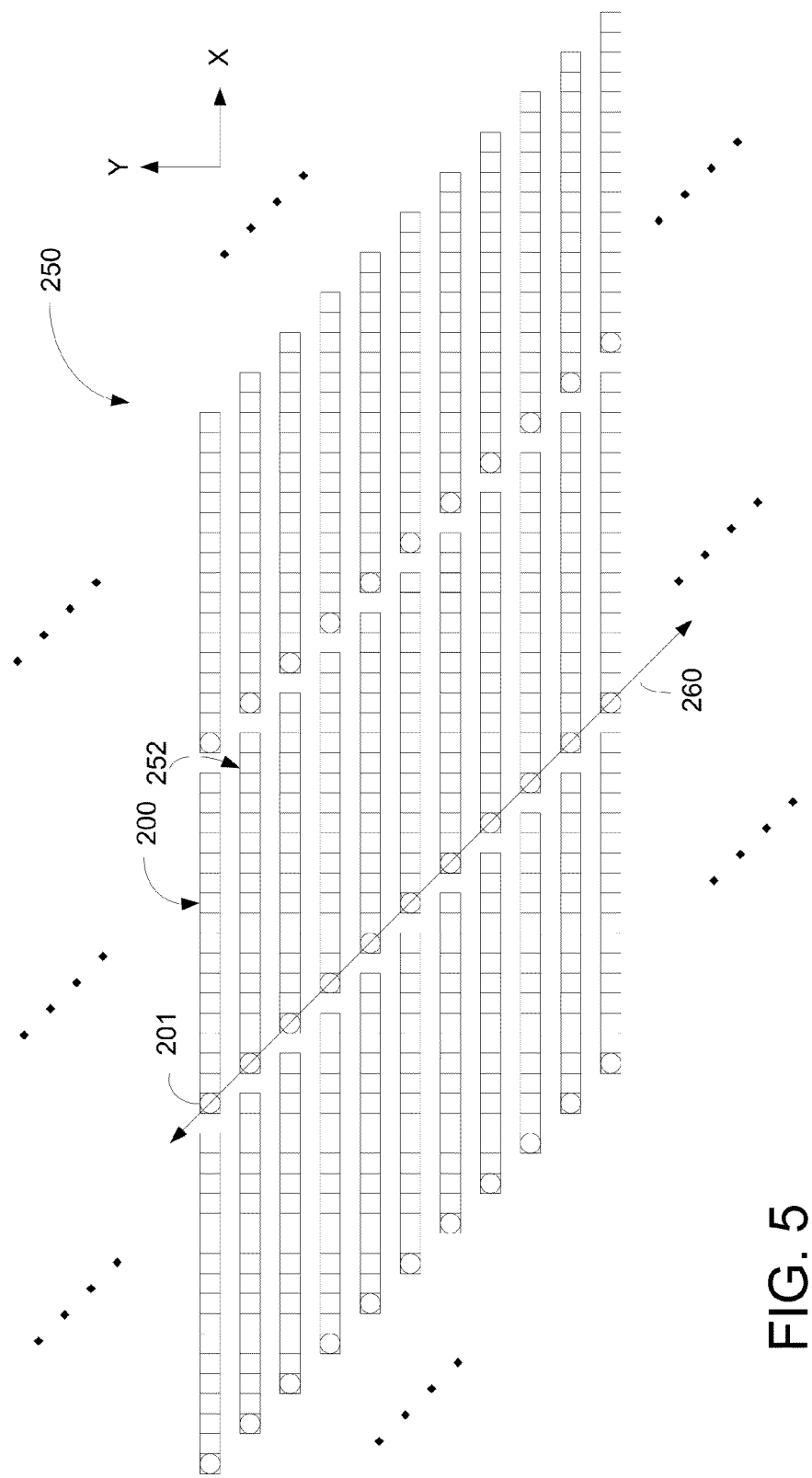
FIG. 5 is a top view of a dual-plane memory array formed using the conductor structures of FIG. 3 as a building block.

As mentioned above, the conductor structure 200 is used as a building block for constructing a dual-plane memory array. To that end, conductor structures of the same shape as the conductor structure 200 are repeated in diagonal direction, such that the wire segments in each of the top, middle, and bottom layers are identical with uniform spacing. FIG. 5 shows this layout. For clarity of illustration, only the top wire segments of the conductor structures are shown. As can be seen, the conductor structure 200 is offset from an adjacent conductor structure 252 in both the X and Y direction. As a result, the vias of the conductor structures lie on uniformly spaced diagonal lines 260. As will be shown more clearly later in FIG. 6, the middle wire segment of the second conductor structure 252 intersects with the top wire segment of the first conductor structure 200. Due to the orientations of the three wire segments of each conductor structure, there can be at most one intersection between two neighboring conductor structures in the memory array 250. Thus, each memory cell in the array can be identified by specifying the two conductor structures that intersect to form the memory cell. Since each conductor structure has one via connecting its three wire segments, each memory cell can be uniquely addressed by specifying the coordinates of the respective vias of the two intersecting conductor structures.

Figure 6:
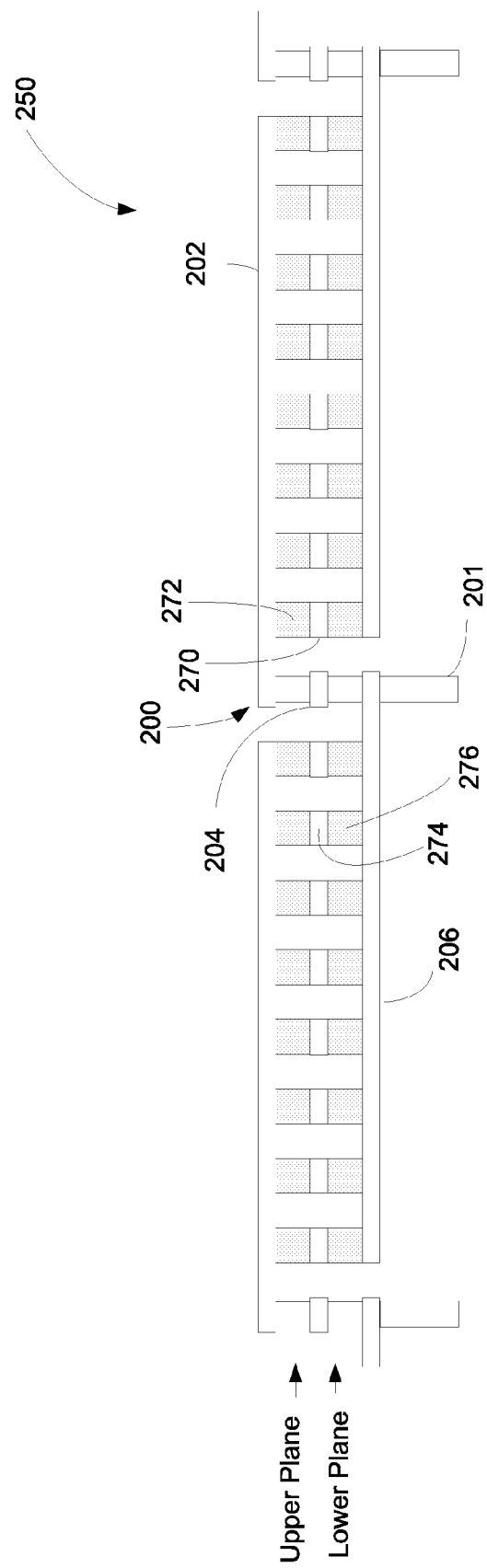
FIG. 6 is a cross-sectional view of the memory array with memory cells formed in two planes.

FIG. 6 shows, in a cross-sectional view, two planes of memory cells formed by the conductor structures. The top wire segment 202 of the conductor structure 200 intersects with a plurality of middle wire segments 270 of neighboring conductor structures to form memory cells. The memory cells form the first plane, or upper plane, of the memory array 250. In some embodiments where the memory cell 272 is a memristive device, the top wire segment 202 functions as the top electrode of the memristive device, the middle wire segment 270 functions as the bottom electrode, and an active region is disposed between the two wire segments. Similarly, the lower wire segment 206 intersects with the middle wire segments 274 of neighboring conductor structures to form memory cells on a lower plane of the memory array 250. In the meantime, the middle wire segment 204 intersects other conductor structures to form a plurality of memory cells on both its upper and lower sides. The number of memory cells formed along the upper wire segment 202 or the lower wire segment 206 depends on the length of the wire segments and the spacing between adjacent wire segments. In the embodiment shown in FIG. 6, each wire segment has 8 memory cells formed thereon. In each of the two memory planes, the memory cells are in a uniform array with no block separations. Thus, there is no need for rows and columns of dummy memory cells typically formed around the perimeter of conventional memory blocks.

Figure 7A:
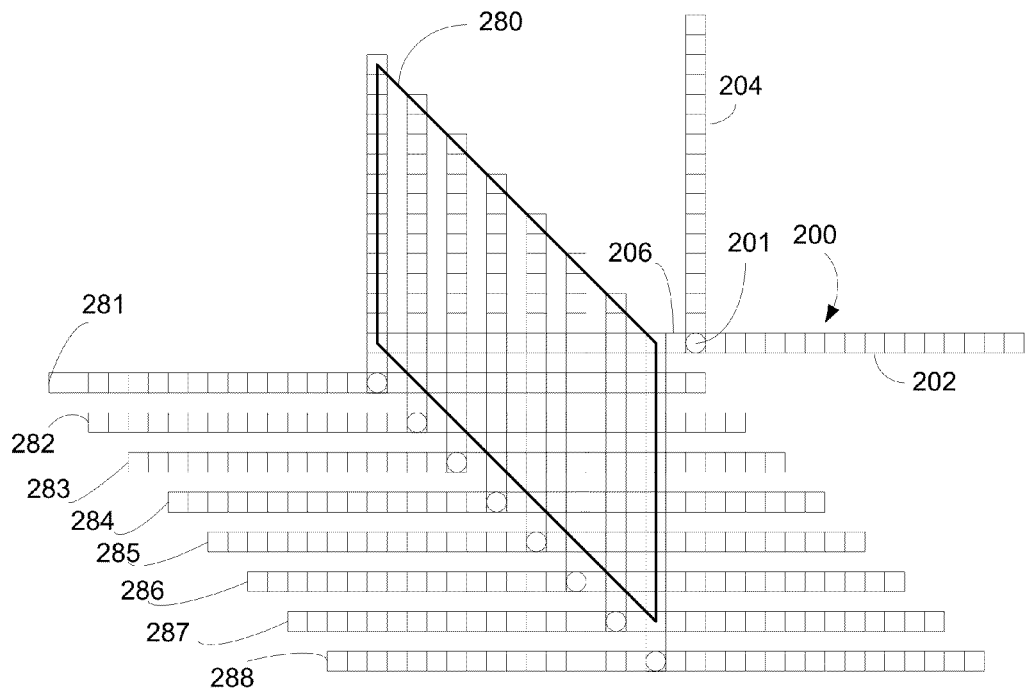
FIGS. 7A and 7B show, respectively, a selected conductor structure and other conductor structures that intersect with it in the two memory planes of the memory structure.
Figure 7B:
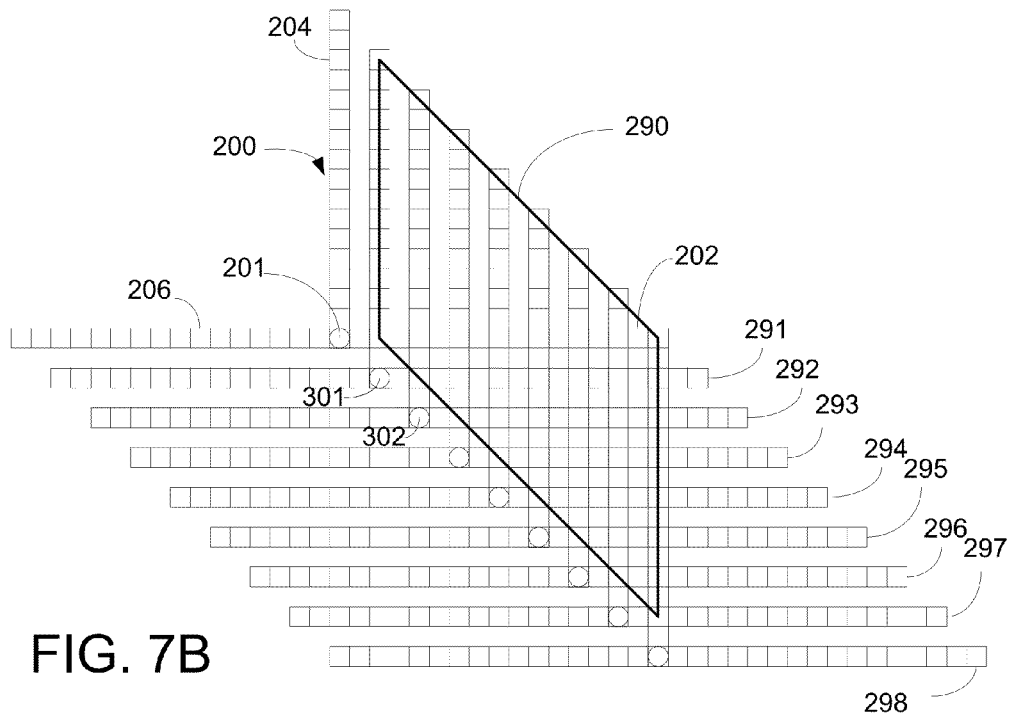
Figure 8:
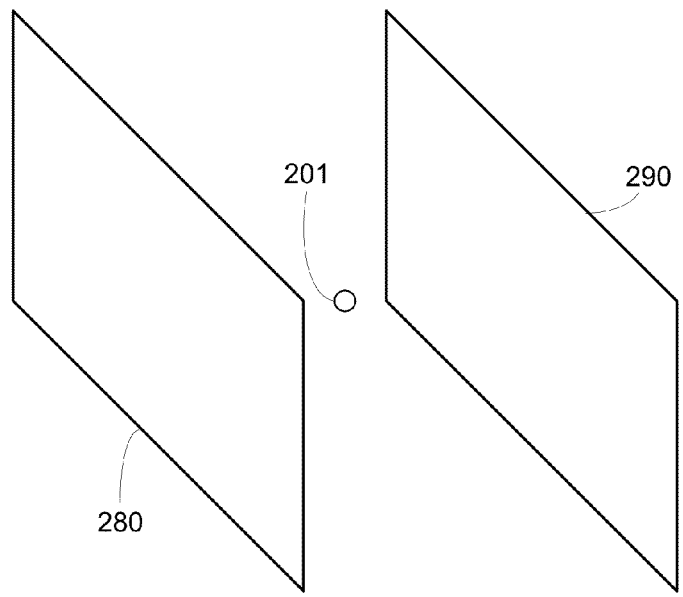
FIG. 8 is a schematic illustration of the address spaces associated with the selected conductor structure in the two memory planes.
Figure 9:
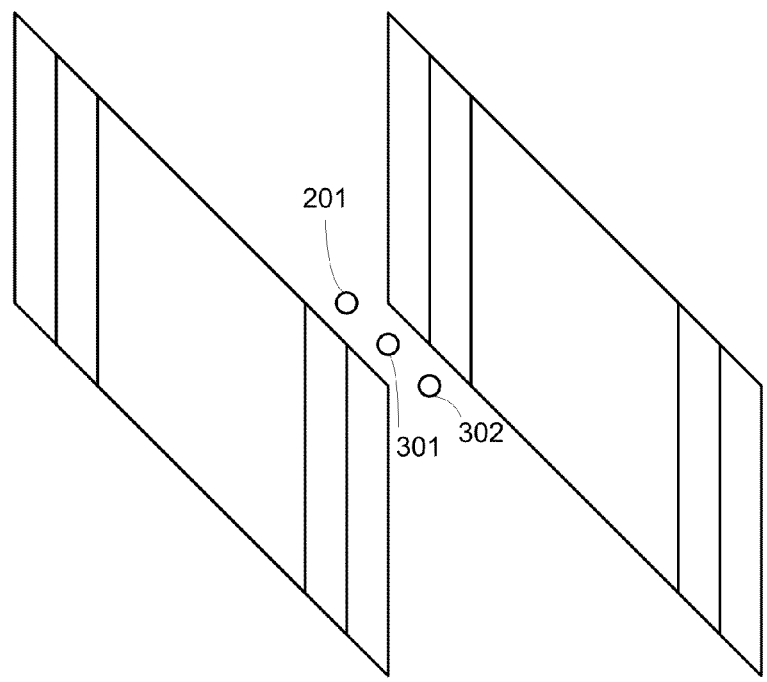
FIG. 9 is a schematic illustration of the overlapping of address spaces associated with adjacent conductor structures.

FIG. 7A shows in a top view the relative location of a conductor structure 200 with respect to its neighboring conductor structures 281-288. As shown in FIG. 7A, the vias of the neighboring conductor structures are arranged along a diagonal line. The middle wire segment of each of those neighboring conductor structures 281-288 intersects with the lower wire segment 206 of the conductor structure 200. Conceptually, the conductor structure 200 may be viewed as defining a parallelogram-shaped address space 280 in the lower plane of memory cells. Similarly, FIG. 7B shows in a top view the conductor structure 200 and another set of neighboring conductor structures 291-298 that intersect with the upper wire segment 202 of the conductor structure 200. Thus, the conductor structure 200 may be viewed as a defining a parallelogram-shaped address space 290 in the upper plane of memory cells. FIG. 8 shows the lower plane address space 280 and the upper plane address space 290 linked by the via 201 of the conductor structure 200. It is to be noted that, as illustrated in FIG. 9, the address spaces associated with each conductor structure (and its via) overlaps with the address spaces of its neighboring conductor structures. For clarity of illustration, only the vias 201, 301, and 302 of three adjacent conductor structures are shown. The overlapping of the address spaces is a property of the array using the conductor structure 200. An advantage of the overlapping address spaces is that a memory array may be designed arbitrarily large without requiring breaks in the memory block, as would be required by conventional two-dimensional structures, such as the one shown in FIG. 2. By not having interior memory block breaks, a higher memory density may be achieved.

Figure 10:
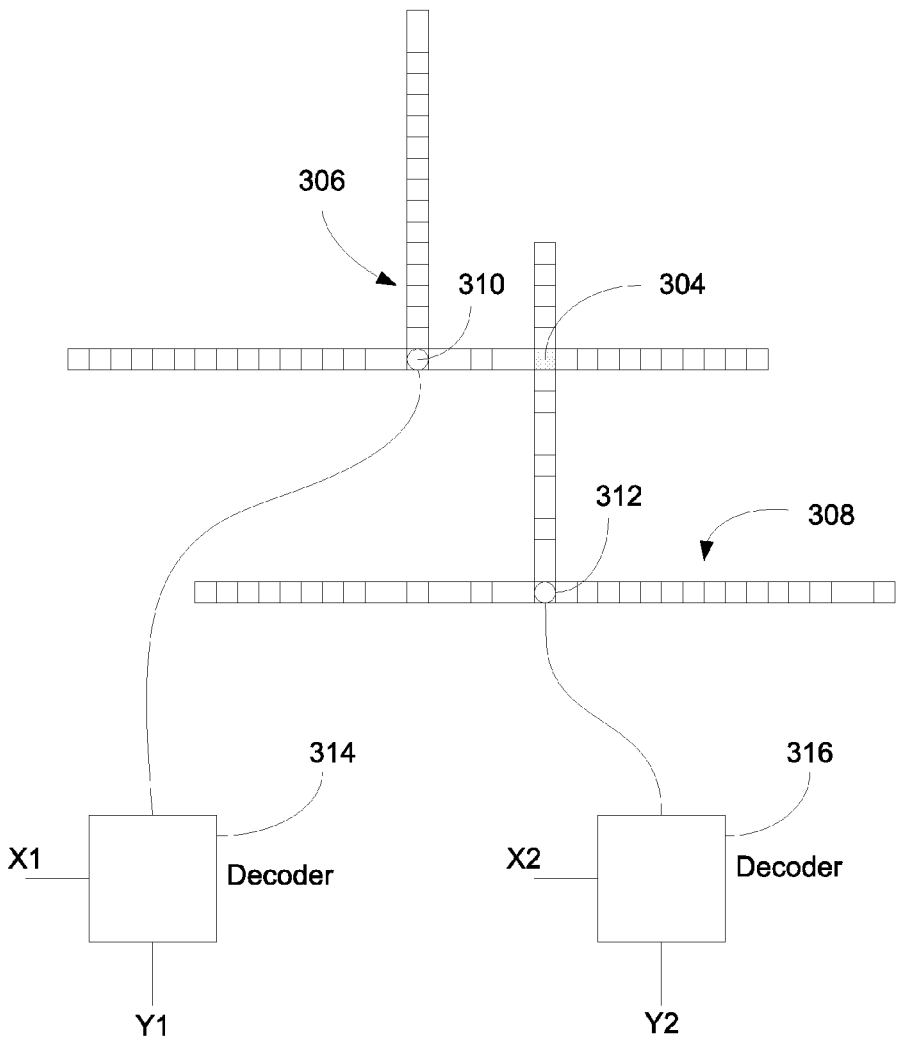
FIG. 10 is a schematic illustration of accessing a memory cell in the dual-plane memory array using two decoders.

Turning now to FIG. 10, to access a given memory cell 304, the two conductor structures 306, 308 that intersect to form the memory cell are identified. This is done by specifying the coordinates (X and Y) of the via of each of the two conductor structures. In this embodiment, two decoders are used. The first decoder 314 is used to decode the address (X1, Y1) used to refer to the via 310 of the first conductor structure 308, and the second decoder 316 is used to decode the address (X2, Y2) for the via 312 of the second conductor structure 308. It should be noted that each of the decoders is used to decode both the X and Y coordinates. This can be done because each of the conductor structures in the memory array features both horizontal and vertical wire segments. As a result, the via, which is the single contact of the conductor structure, can be used as either a row contact or a column contact. In contrast, in some other multi-layer structures designed for advanced "4-D" addressing schemes, one decoder is required for each of the X and Y coordinates of each of the two contact points. Thus, the architecture of FIG. 10 uses only half of the number of decoders required by those other "4-D" addressing multi-layer structures. A benefit of the reduced number of decoders required is that the decoders can fit well in the CMOS layer under the memory array, and can leave space in the CMOS layer for other circuits, such as the read and write circuits.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A memory array comprising:
   a plurality of conductor structures, each conductor structure having a top wire segment extending in a first direction, a middle wire segment extending in a second direction at an angle from the first direction, a bottom wire segment extending in a direction opposite to the first direction, and a via connecting the top, middle, and bottom wire segments;
   a plurality of memory cells in an upper plane formed at intersections of the middle wire segment of each conductor structure with the top wire segments of neighboring conductor structures; and
   a plurality of memory cells in a lower plane formed at intersections of the middle wire segment of each conductor structure with the bottom wire segments of neighboring conductor structures.

2. A memory array as in claim 1, wherein the plurality of conductor structures are arranged in the memory array such that the vias of adjacent conductor structures are disposed in a diagonal line.

3. A memory array as in claim 2, wherein the top, middle, and bottom wire segments of the plurality of conductor structures are dimensioned such that each top or bottom wire segment is to intersect a selected number of middle wire segments, and each middle wire segment is to intersect the selected number of top wire segments and the selected number of bottom wire segments.

4. A memory array as in claim 1, wherein the plurality of memory cells are memristive devices.

5. A memory array as in claim 4, wherein each memory cell has an active region containing a switching material formed of a metal oxide.

6. A memory array comprising:
   a plurality of top wire segments extending in a first direction in a top layer;
   a plurality of middle wire segments in a middle layer extending in a second direction at an angle to the first direction;
   a plurality of bottom wire segments in a bottom layer extending in a direction opposite to the first direction;

a plurality of memory cells in an upper plane formed at intersections of plurality of the top wire segments with the plurality of middle wire segments;

a plurality of memory cells in a lower plane formed at intersections of the plurality of middle wire segments with the plurality of bottom wire segments; and a plurality of vias, each via connecting a top wire segment, a middle wire segment, and a bottom wire segment.

7. A memory array as in claim 6, wherein the plurality of vias are arranged in diagonal lines.

8. A memory array as in claim 7, wherein the top, middle, and bottom wire segments are dimensioned such that each top or bottom wire segment is to intersect a selected number of middle wire segments, and each middle wire segment is to intersect the selected number of top wire segments and the selected number of bottom wire segments.

9. A memory array as in claim 6, wherein the plurality of memory cells are memristive devices.

10. A memory array as in claim 9, wherein each memory cell has an active region having a switching material formed of a metal oxide.

11. A memory array comprising:

a plurality of conductor structures, each conductor structure having a top wire segment, a middle wire segment, and bottom wire segment connected together by a via, with top and bottom wire segments extending in opposite directions and the middle wire segment extending in a direction perpendicular to the top and bottom wire segments;

a plurality of memory cells disposed in an upper plane and a lower plane, each memory cell in the upper plane being formed at an intersection of a top wire segment of a conductor structure with a middle wire segment of another conductor structure, and each memory cell in the lower plane being formed at an intersection of a bottom wire segment of a conductor structure with a middle wire segment of another plurality of conductor structure; and decoders disposed in a plane under the conductor structures for decoding addresses of the vias of two conductor structures for accessing a memory cell formed at an intersection of the two conductor structures.

12. A memory array as in claim 11, wherein the top, middle, and bottom wire segments of the plurality of conductor structures are dimensioned such that each top or bottom wire segment is to intersect a selected number of middle wire segments, and each middle wire segment is to intersect the selected number of top wire segments and the selected number of bottom wire segments.

13. A memory array as in claim 12, wherein the vias of the plurality of conductor structures are formed along diagonal lines.

14. A memory array as in claim 13, wherein the plurality of memory cells are memristive devices.

15. A memory array as in claim 14, wherein each memory cells has an active region containing a switching material formed of a metal oxide.

* * * * *

UNITED STATES PATENT AND TRADEMARK OFFICE
CERTIFICATE OF CORRECTION

| | | |
|---|---|---|
| PATENT NO. | : 8,933,431 B2 | Page 1 of 1 |
| APPLICATION NO. | : 14/006719 | |
| DATED | : January 13, 2015 | |
| INVENTOR(S) | : Frederick Perner | |

It is certified that error appears in the above-identified patent and that said Letters Patent is hereby corrected as shown below:

In the Claims

In column 7, line 2, in Claim 6, delete "intersections of" and insert -- intersections of the --, therefor.

In column 7, line 2, in Claim 6, delete "plurality of the" and insert -- plurality of --, therefor.

Signed and Sealed this
Fourth Day of August, 2015

Michelle K. Lee
*Director of the United States Patent and Trademark Office*